(12) United States Patent
Yamamoto et al.

(10) Patent No.: US 7,221,056 B2
(45) Date of Patent: May 22, 2007

(54) SEMICONDUCTOR INTEGRATED CIRCUIT DEVICE AND MANUFACTURING METHOD THEREOF

(75) Inventors: Naoki Yamamoto, Kawaguchi (JP); Akio Nishida, Takarazuka (JP); Akira Fujimoto, Kadoma (JP); Hiraku Chakihara, Hitachinaka (JP); Hideyuki Matsuoka, Nishitokyo (JP); Toshiyuki Mine, Fussa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/871,282

(22) Filed: Jun. 21, 2004

(65) Prior Publication Data

US 2005/0073051 A1 Apr. 7, 2005

(30) Foreign Application Priority Data

Sep. 24, 2003 (JP) ............................ 2003-331107

(51) Int. Cl.
  *H01L 23/495* (2006.01)
(52) U.S. Cl. ...................................... 257/763
(58) Field of Classification Search ...................... None
  See application file for complete search history.

(56) References Cited

U.S. PATENT DOCUMENTS

| | | | |
|---|---|---|---|
| 4,505,028 A | | 3/1985 | Kobayashi et al. |
| 5,387,540 A | | 2/1995 | Poon et al. |
| 5,719,410 A | | 2/1998 | Suehiro et al. |
| 6,236,059 B1 * | | 5/2001 | Wolstenholme et al. ........ 257/3 |
| 6,476,488 B1 * | | 11/2002 | Jeng et al. ................... 257/751 |
| 7,119,443 B2 * | | 10/2006 | Nakamura et al. ............ 257/763 |
| 2003/0064578 A1 * | | 4/2003 | Nakamura et al. ............ 438/627 |
| 2003/0205811 A1 * | | 11/2003 | Nakamura et al. ............ 257/751 |
| 2004/0224476 A1 * | | 11/2004 | Yamada et al. ............... 438/400 |
| 2005/0040452 A1 * | | 2/2005 | Nakamura et al. ............ 257/307 |
| 2005/0239246 A1 * | | 10/2005 | Manning ...................... 438/257 |

FOREIGN PATENT DOCUMENTS

| | | |
|---|---|---|
| JP | 56-107552 | 8/1981 |
| JP | 59-10271 | 1/1984 |

(Continued)

OTHER PUBLICATIONS

Akasaka et al, IEEE Transactions on Electron Devices, vol. 43, No. 11, Nov. 1996, pp. 1864-1869.

(Continued)

*Primary Examiner*—Michael Lebentritt
*Assistant Examiner*—Andre' Stevenson
(74) *Attorney, Agent, or Firm*—Mattingly, Stanger, Malur & Brundidge, P.C.

(57) ABSTRACT

A manufacturing process for a semiconductor integrated circuit device prevents occurrence of reaction between metal wiring and a boron-doped silicon plug over it in heat treatment for a MOS transistor to be formed over them and reduces the possibility of rise in contact resistance. Metal boride is formed on an exposed metal surface in the bottom of an opening made in an interlayer insulating film over the metal wiring. In order to facilitate formation of such metal boride, metal oxide remaining on the metal surface is removed with an aqueous ammonia solution. The metal surface is irradiated with high energy ultraviolet light in order to remove organic matter remaining in the opening and facilitate removal of the metal oxide with the aqueous ammonia solution.

10 Claims, 5 Drawing Sheets

FOREIGN PATENT DOCUMENTS

| | | |
|---|---|---|
| JP | 60-72229 | 4/1985 |
| JP | 60-89943 | 5/1985 |
| JP | 60-123060 | 7/1985 |
| JP | 61-127123 | 6/1986 |
| JP | 61-127124 | 6/1986 |
| JP | 61-150236 | 7/1986 |
| JP | 61-152076 | 7/1986 |
| JP | 61-267365 | 11/1986 |
| JP | 1-94657 | 4/1989 |
| JP | 3-119763 | 5/1991 |
| JP | 5-90202 | 4/1993 |
| JP | 7-94716 | 4/1995 |
| JP | 8-264531 | 10/1996 |
| JP | 8-306917 | 11/1996 |
| JP | 2001-274248 | 10/2001 |

OTHER PUBLICATIONS

Elsevier, Applied Surface Science 117/118, 1997, pp. 312-316.

Nakajima et al, "Advanced Metalization Conference: Japanese Session", Tokyo Univ., 1995.

Bernd Goehel et al, IEEE Transactions on Electron Devices, vol. 48, No. 5, May 2001, pp. 897-906.

* cited by examiner

SEMICONDUCTOR INTEGRATED CIRCUIT DEVICE AND MANUFACTURING METHOD THEREOF

FIELD OF THE INVENTION

The present invention relates to a semiconductor integrated circuit device and manufacturing technology thereof and more particularly to a semiconductor integrated circuit device which has a polycrystalline silicon layer over a metal layer and technology which is effective for the manufacture thereof.

BACKGROUND OF THE INVENTION

In a semiconductor integrated circuit device structure in which a layer of metal such as tungsten is laid over a silicon substrate or polycrystalline silicon, it is common to provide a reaction suppression layer (barrier layer) in the interface between the metal layer and the silicon layer, as exemplified by the techniques disclosed in patent documents 1 to 4 (listed below). Also, techniques which concern a polymetal gate as a kind of multi-layer gate electrode are described in patent documents 5 to 21 and non-patent documents 1 to 3.

For a polycide gate which has tungsten silicide (tungsten silicon compound) over a polycrystalline silicon film, the metal layer is made of silicide (for example, tungsten silicide) from the beginning in order to suppress reaction between the metal, thereby preventing film peeling due to thermal reaction or various problems of poor electrical characteristics of a semiconductor device.

On the other hand, in order to meet demand for higher density and larger scale integration of semiconductor integrated circuits, microfabrication technology has been used for various elements. This microfabrication technology has rapidly progressed since it has proven to be remarkably effective in enhancing the performance of MOS transistors. However, in manufacturing a semiconductor integrated circuit device at the 130 nm or finer microfabrication technology node, it has become difficult to achieve the target performance, high density and large scale integration just by arranging devices as its elements such as MOS transistors on a silicon substrate (wafer) two-dimensionally. For this reason, studies are ongoing to develop three-dimensional semiconductor integrated circuits in which elements such as transistors are laid vertically one upon another. Non-patent document 4 describes what is called a "vertical MOS transistor" in which its elements (source, channel, drain) are vertically arranged.

The above-cited documents concerning the prior art are as follows.

Patent document 1: JP-A No. 090202/1993
Patent document 2: JP-A No. 306917/1996
Patent document 3: JP-A No. 274248/2001
Patent document 4: JP-A No. 228346/2001
Patent document 5: JP-A No. 89943/1985
Patent document 6: JP-A No. 150236/1986
Patent document 7: JP-A No. 72229/1985
Patent document 8: JP-A No. 10271/1984
Patent document 9: JP-A No. 107552/1981
Patent document 10: JP-A No. 127123/1986
Patent document 11: JP-A No. 127124/1986
Patent document 12: JP-A No. 123060/1985
Patent document 13: JP-A No. 152076/1986
Patent document 14: JP-A No. 267365/1986
Patent document 15: JP-A No. 94657/1999
Patent document 16: JP-A No. 264531/1996
Patent document 17: JP-A No. 119763/1991
Patent document 18: JP-A No. 94716/1995
Patent document 19: U.S. Pat. No. 4505028 specifications
Patent document 20: U.S. Pat. No. 5719410 specification
Patent document 21: U.S. Pat. No. 5387540 specification
Non-patent document 1: Akasaka et al, "IEEE Transaction Electron devices," Vol. 43, No. 11, November 1996, pp. 1864–1869
Non-patent document 2: Elsevier, "Applied Surface Science 117/118" (1997), pp. 312–316
Non-patent document 3: Nakajima et al, "Advanced metalization conference, Japan Session," Tokyo Univ. (1995)
Non-patent document 4: Bernd Goehel et al, "IEEE Transaction Electron devices," Vol. 48, No. 5, May 2001, pp. 897–906

For a three-dimensional semiconductor integrated circuit device, a MOS transistor whose operating speed should be high may be provided on a silicon substrate and a MOS transistor whose operating speed is relatively low may be laid over it. In other words, it has been commonly considered that an N-type MOS transistor should be provided on the main surface of the silicon substrate and a P-type MOS transistor should be laid over them. For the wiring which connects the lower transistor and the upper one may be made of polycrystalline silicon doped with a high concentration of impurities. In this case, a silicon region doped with a high concentration of N-type impurities such as the source, drain or gate electrode in the lower (N-type) MOS transistor must be connected with a silicon layer with a high concentration of P-type impurities in the upper transistor. The silicon layer which is used as a connecting conductor should contain a high concentration of impurities. However, if it should contain N-type impurities such as phosphorous, conductivity failures might occur in the area of connection with the upper (P-type) MOS transistor. Contrariwise, if it should contain P-type impurities, connection with the lower (N-type) MOS transistor would be difficult.

The layer which connects these MOS transistors also serves as wiring for connection with peripheral circuitry. If the wiring should be made of polycrystalline silicon, the wiring resistance would cause a considerable signal delay and hamper high speed operation of the semiconductor integrated circuit. Hence, as the material for the wiring, a metal with a high melting point like tungsten is more suitable than polycrystalline silicone.

When metal such as tungsten is used for the wiring, in a thermal process for the manufacture of a semiconductor integrated circuit device, reaction between the silicon and the wiring metal may occur in the areas of connection between the upper and lower MOS transistors and the wiring, resulting in an interference to the manufacturing process or MOS transistor deterioration. For the purpose of preventing such reaction, a reaction barrier film is inserted between the layers. The region in which a silicon layer is laid for connection between the wiring (tungsten layer) and the upper MOS transistor has such a structure that a polymetal gate in the prior art as mentioned above is turned upside down. Therefore, tungsten nitride (its use for the polymetal gate is publicly known) has been so far used for the reaction barrier film between the metal layer (tungsten, etc) and the silicon layer above it. However, in this type of semiconductor integrated circuit device, the contact resistance at the silicon connection between the tungsten wiring layer and the P-type MOS transistor is as high as $10^{-5}$ ohm-cm$^2$ to $10^{-2}$ ohm-cm$^2$, which makes it difficult to manufacture a high speed semiconductor integrated circuit device. In order to decrease the contact resistance, on the analogy of a polycide gate in the above prior art, an attempt was made to insert thin tungsten silicide between the tungsten nitride barrier and the silicon layer doped with a high concentration of P-type impurities in the P-type MOS transistor. However, even in this structure, it was difficult to decrease the contact resistance to $10^{-5}$ ohm-cm$^2$ or less.

SUMMARY OF THE INVENTION

One approach to a semiconductor integrated circuit device manufacturing process in which high temperature treatment hardly causes reaction between the metal and silicon and does not result in a rise in the contact resistance is that a very thin film of metal boride or metal-boron-silicon compound (metal silicon boride) is formed on the metal surface (tungsten, etc) before a boron-doped silicon layer is formed. This metal boride can be produced in the process of formation of the boron-doped silicon film through CVD (Chemical Vapor Deposition) equipment as follows: boron hydride gas is introduced into a reaction chamber and the metal surface is irradiated with the gas to produce metal boride, then silicon hydride reactive gas is introduced while boron hydride gas is continuously being led into the reaction chamber. Another approach is that boron ions are implanted into a metal top surface through an ion implanter to produce metal boride and then form a boron-doped silicon film.

When such metal boride is formed by irradiation with boron hydride gas, it is desirable to remove metal oxide from the surface of metal such as tungsten in advance. Such metal oxide can be removed by an aqueous ammonia solution. Doing so offers the advantage that only metal oxide on an exposed metal surface in the bottom of the opening (contact hole) can be removed, minimizing the possibility of accidental etching of silicon base interlayer insulating film formed on purpose or the silicon layer, without expansion of the contact hole in the metal wiring provided in the interlayer insulating film. In the process of making an opening by photolithography or dry etching, organic matter may remain in the bottom of the opening, which can interfere with the formation of metal boride as mentioned above. This organic matter can be removed by irradiation with ultraviolet light. However, some kind of organic matter may not be removed by irradiation with ultraviolet light with a wavelength of 250 nm or so which is usually employed for photoresist removal. For this reason, it is more desirable to use both such ultraviolet light and higher energy ultraviolet light, or ultraviolet light with a wavelength of 150 nm or so. Such higher energy ultraviolet light oxidizes the top surface of tungsten and produces the most stable form of tungsten oxide $WO_3$. Various types of crystalline natural tungsten oxide which lack oxygen are present on the tungsten film surface. Such oxygen-poor natural oxide may not be removed by an aqueous ammonia solution as mentioned above. When, as a countermeasure to this, tungsten oxide such as $WO_3$ is made by irradiation with the above two types of ultraviolet light in advance, natural metal oxide is removed with an aqueous ammonia solution more efficiently.

Typical preferred embodiments of the present invention will offer the following advantageous effect.

For a semiconductor integrated circuit device with a vertically multi-layered P-channel MOS transistor over a metal wiring layer, reaction between the metal and boron-doped silicon in the area of connection of the wiring and the transistor is suppressed and the contact resistance in their interface is low so that the MOS transistor assures high drive current.

BRIEF DESCRIPTION OF THE DRAWINGS

The invention will be more particularly described with reference to the accompanying drawings, in which:

FIGS. 3A to 3E show different crystal structures of tungsten boride formed on tungsten wiring according to a first embodiment of the present invention, where

FIGS. 4A and 4B show conventional multi-layer structures (metal wiring/barrier/boron-doped silicon plug) where

DETAILED DESCRIPTION OF THE PREFERRED EMBODIMENTS

Next, preferred embodiments of the present invention will be described in detail referring to the accompanying drawings. In all the drawings which illustrate the preferred embodiments, elements with like functions are designated by like reference numerals and repeated description of such elements will be omitted. In connection with the preferred embodiments described below, same or similar explanations will not be repeated except when necessary.

Furthermore, the following preferred embodiments will be described separately, but they are not irrelevant to each other unless otherwise specified. They are, in whole or in part, variations of each other and sometimes one description is a detailed or supplementary form of another. Also, in the preferred embodiments described below, even when a specific numerical figure (the number of pieces, numerical value, quantity, range, etc.) is indicated for an element, it is not limited to the indicated specific numerical figure unless otherwise specified or theoretically limited to the specific numerical figure; it may be larger or smaller than the specific numerical figure. In the preferred embodiments described below, it is needles to say that their constituent elements (including constituent steps) are not necessarily essential unless otherwise specified or theoretically essential.

Similarly, in the preferred embodiments described below, when specific forms, positions or other factors are indicated for certain elements, forms, positions or other factors which are virtually equivalent or similar to the specific ones may be used unless otherwise specified or unless only the specific ones should be used from a theoretical viewpoint. The same can be said of numerical values or ranges as mentioned above.

Here, a "semiconductor integrated circuit wafer" or "semiconductor wafer" refers to a silicon single crystal substrate (usually circular), sapphire substrate, glass substrate or other insulating, semi-insulating or semiconductor substrate or a combination of these which is used in the manufacture of semiconductor integrated circuits. "Semiconductor integrated circuit devices" (or "electronic devices" or "electronic circuit devices") not only include those which are formed on a single-crystal silicon substrate, but also those which are formed on any of the abovementioned various substrates or other types of substrates such as SOI (Silicon On Insulator) substrates, substrates for TFT (Thin Film Transistor) liquid crystal and substrates for STN (Super Twisted Nematic) liquid crystal, unless otherwise specified.

When reference is made to the composition of a material or gas, it should be interpreted that the material or gas may contain not only expressly indicated ingredients but also other ingredients, unless otherwise specified.

For instance, regarding the composition of a gas, it is allowed that the gas contains not only a main reactive gas or processing gas but also an additive gas, diluting gas or auxiliary gas which causes secondary action.

Here, "silicon oxide film" generally includes various types of silicon oxide film which contain various additives or auxiliary ingredients, namely PSG (Phosphosilicate Glass) film, BPSG (Borophospho Silicate Glass) film, TEOS (Tetra-Ethoxy Silane) oxide film, silicon oxynitride film and other single or mixed ingredient film, unless otherwise specified.

Also, "silicon nitride" here includes not only $Si_3N_4$ but also insulating film of silicon nitride with a similar composition.

"Gate oxide film" includes thermally oxidized silicon film, silicon oxynitride film and other types of thermally oxidized, deposited or coated film and its material includes non-silicon metal oxide, insulating nitride such as silicon nitride, or a combination of these.

Regarding the material of a conductive region on a substrate surface or deposited film, "silicon" or "silicon base" refers not only to relatively pure silicon but also to silicon doped with impurities or additives or other silicon-base conductive material (for example, SiGe alloy, a silicon base alloy which contains not less than 50% of Ge; SiGe is used, for example, for the gate polysilicon or channel region), unless otherwise specified. Unless technically unallowable, it is also accepted that these materials originally have high resistance.

Some types of deposited film or the like are amorphous when just deposited, then become polycrystalline immediately after being heat-treated. To avoid terminology inconsistency, these may be indicated as polycrystalline film. For instance, polycrystalline silicon (polysilicon) is amorphous just when deposited, and becomes polycrystalline as it is heat-treated.

Needless to say, it is acceptable to use silicon which is polycrystalline from the beginning. When film just deposited is amorphous, it is advantageous in the following points: it prevents channeling in ion implantation; helps avoid dry etching difficulties associated with workability which depends on granularity and assures low sheet resistance after heat treatment.

Figure 1:
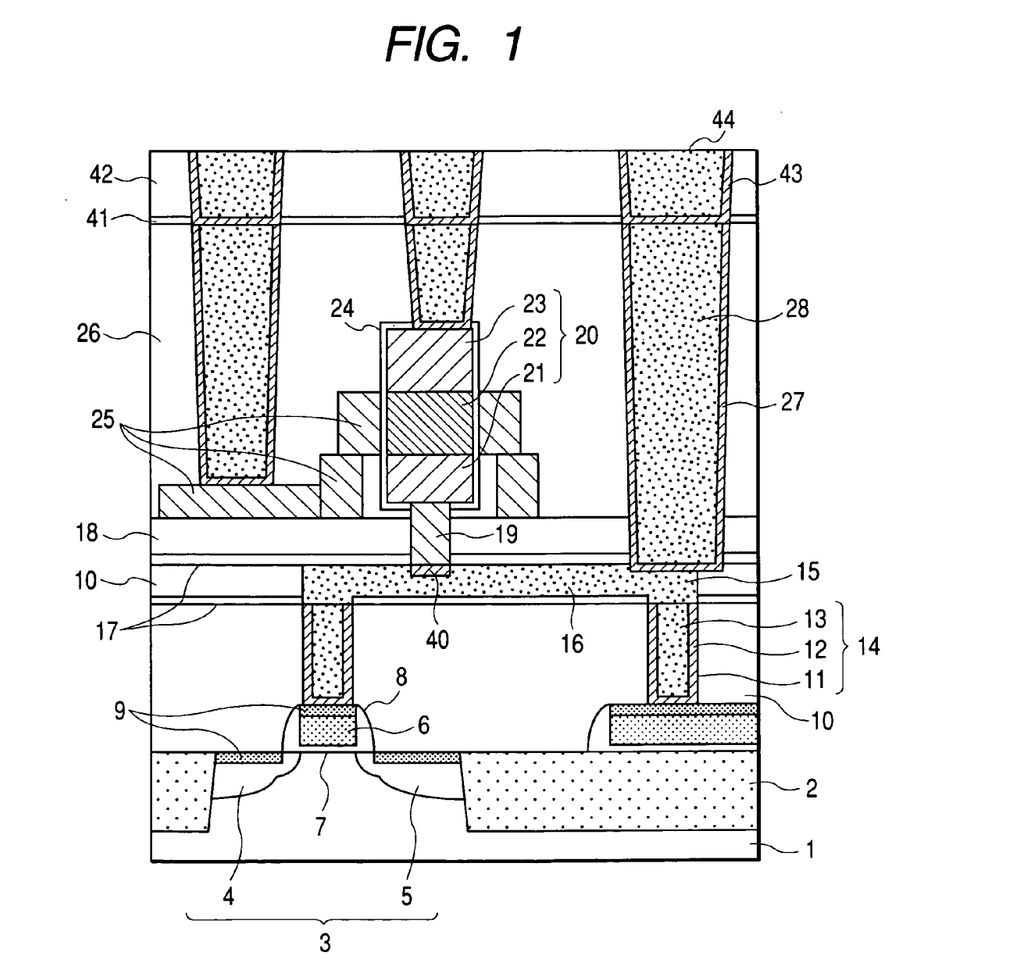
FIG. 1 is a sectional view showing the key part of a semiconductor integrated circuit device in which a vertical P-channel MOS transistor is laid over wiring according to an embodiment of the present invention.
Figure 2:
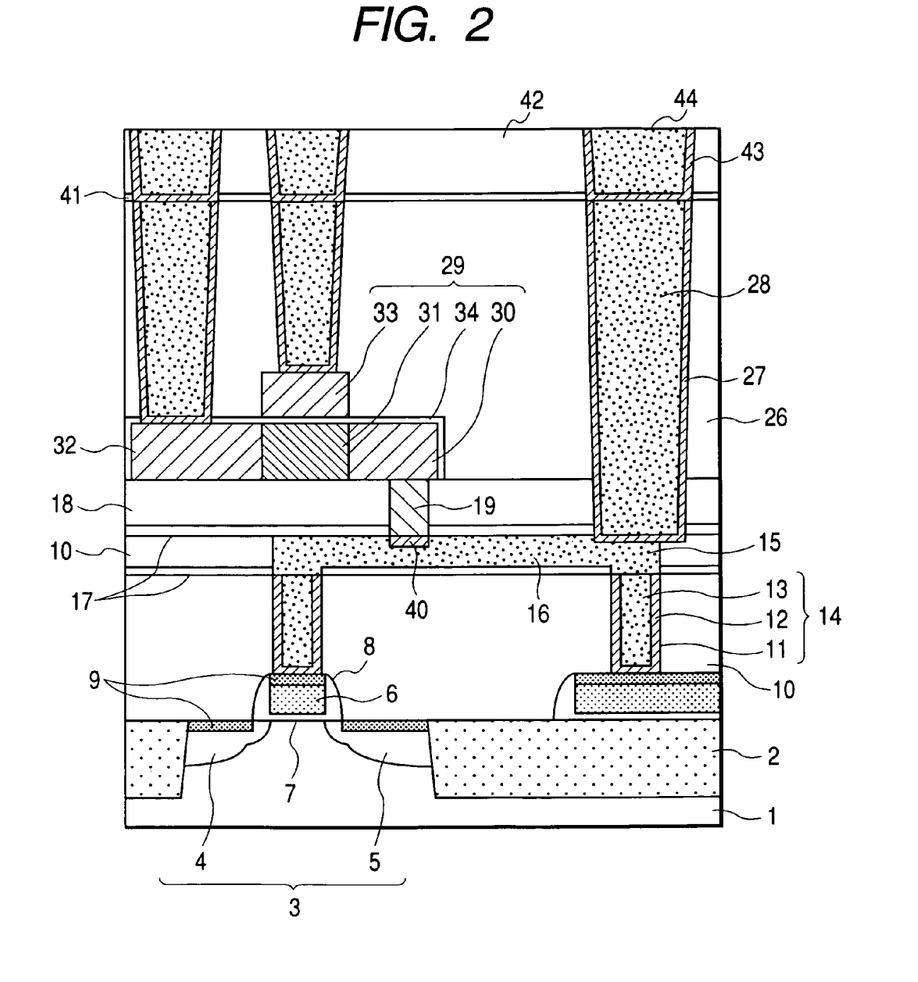
FIG. 2 is a sectional view showing the key part of a semiconductor integrated circuit device in which a horizontal P-channel MOS transistor is laid over wiring according to an embodiment of the present invention.

The present invention concerns a structure which is required to manufacture a semiconductor integrated circuit device in which a MOS transistor is three-dimensionally arranged, and a manufacturing method thereof. FIGS. 1 and 2 show a cross section of the device. A MOS transistor is formed on a main surface of a silicon single crystal substrate and a MOS transistor formed on interlayer insulating film and these transistors are connected through the interlayer insulating film. For the preferred embodiments discussed below, explanations will be given only of elements associated with the problems to be solved by the present invention. Other elements, which are not directly associated with the problems, and the processes of making them are common to the embodiments, so the elements and the processes will be briefly outlined next.

In this type of semiconductor integrated circuit device, an isolating region 2 (buried silicon oxide) is formed in a trench with a depth of 350 nm on the main surface of a silicon single crystal substrate 1. An N-channel MOS transistor and a P-channel MOS transistor are formed on the main surface of the substrate. An N-channel MOS transistor 3 with 100 nm gate length is shown in FIGS. 1 and 2. Based on silicon nitride film 8 provided on the gate electrode side wall, 20 nm thick cobalt silicide film 9 is formed on surfaces of a source 4, a drain 5 and a gate electrode 6 of the transistor, using the known salicide technology (self-aligned silicidation technology). Using CVD technology, 600 nm thick silicon oxide interlayer insulating film 10 is formed over them and its surface is planarized by polishing a convex area which exists because of the presence of the transistor below it, using CMP (Chemical Mechanical Polishing) technology.

An opening 11 (contact hole, etc) is made to connect the source 4, drain 5 or gate electrode 6 of the transistor with a first wiring layer 16 of tungsten. A metal plug 14 is formed by making 10 nm thick titanium nitride barrier film 12 and tungsten film 13 in the opening. Then, a 120 nm deep trench 15 is made on the interlayer insulating film surface in a desired first wiring pattern by dry etching and tungsten is buried in the trench by sputtering and using CVD technology. After that, extra tungsten inside and outside the trench is removed using CMP technology so that the tungsten wiring 16 is formed.

The process of making a wiring pattern on an insulating film surface in this way is called "damascene" technology. Using plasma CVD technology, 30 nm thick silicon nitride film layers 17 and 100 nm thick silicon oxide interlayer insulating film 18 are deposited over it and irregular surface areas of the interlayer insulating film are polished using CMP technology until they are planarized. An opening as a contact hole is made in the silicon oxide interlayer insulating film 18 at a desired position of the buried tungsten wiring 16, namely the first wiring layer. Silicon doped with boron ($4 \times 10^{20}$ atoms/cm$^3$) is deposited in the opening using CVD equipment and extra silicon film inside and outside the opening is removed by CMP so that a silicon plug 19 is formed. The diameter of contact between this silicon plug and the first wiring layer is 0.1 μm. A main advantage of the present invention is that even after a heat treatment process (700–900° C.) necessary to form a MOS transistor over the silicon plug 19, reaction between the first wiring (tungsten wiring) 16 and the silicon plug 19 does not occur and the contact resistance in their interface does not rise.

As shown in FIG. 1, the MOS transistor 20 formed over the polysilicon plug 19 has a vertically multi-layered structure which consists of a drain 21, a channel 22, and a source 23. This is achieved by depositing, first, silicon doped with boron ($4 \times 10^{20}$ atoms/cm$^3$) through a CVD process and then pure silicon over it and again silicon doped with boron ($4 \times 10^{20}$ atoms/cm$^3$). The thickness of these silicon layers is all 300 nm. After this, the silicon for the channel is crystallized through heat treatment in a nitrogen atmosphere. Then, a multi-layer column with a diameter of 200 nm is made of the silicon by photolithography and dry etching in a usual manner. In the column, the layer which is in touch with the silicon plug 19 serves as the drain 21, the layer above it as the channel 22 and the top layer as the source 23. Then, 3.5 nm thick silicon oxide film 24 is formed on the side wall of the channel region of the column by wet oxidization. Again, silicon doped with boron ($4\times10^{20}$ atoms/cm$^3$) is deposited with a thickness of 150 nm and the silicon film is processed by photolithography and dry etching so that a gate electrode 25 is formed on the side wall of the silicon multi-layer column. After this, interlayer insulating film 26 is formed again and multi-layer electrode wiring consisting of titanium nitride 27 and tungsten 28 layers is provided for connection with the source 23 and the gate electrode 25, thereby making up a semiconductor integrated circuit device with the vertical MOS transistor 20 over the tungsten wiring 16.

On the other hand, for a semiconductor integrated circuit device as shown in FIG. 2, after formation of the silicon plug 19 (FIG. 1), 200 nm thick film of undoped silicon is deposited and the silicon film is roughly crystallized through heat treatment in a nitrogen atmosphere before a P-channel MOS transistor 29 is formed in the same manner as when a MOS transistor is formed on the main surface of the silicon single crystal substrate. In this case, a drain 30, a channel 31 and a source 32 are located inside the silicon film. A gate electrode 33 of this transistor is located above the channel through gate oxide film 34, as shown in the figure. However, it may be located below the silicon film of the channel.

The semiconductor integrated circuit device with the upper MOS transistor whose source, channel, and drain are arranged in a plane as shown in FIG. 2 is easier to manufacture than the one with the vertically multi-layered MOS transistor 20 as shown in FIG. 1. However, the vertically multi-layered transistor is suitable for high density integrated circuits and thus makes microfabrication of semiconductor integrated circuit device chips easy. Concretely, when the upper MOS transistor 29 as shown in FIG. 2 is employed, the integrated circuit device chip size is approx. 15% smaller than when all the above MOS transistors are formed on the main surface of a silicon single crystal substrate; and moreover when the upper MOS transistor 20 as shown in FIG. 1 is employed, the chip size is approx. 40% smaller.

<First Embodiment>

Figure 4A:
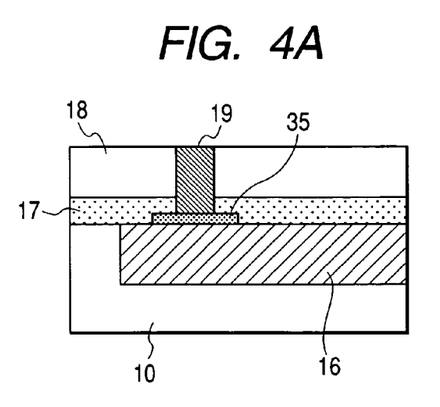
FIG. 4A shows a tungsten nitride barrier inserted between tungsten wiring and a silicon plug and FIG. 4B shows a barrier as a laminate of tungsten nitride and tungsten silicide inserted between them.
Figure 4B:
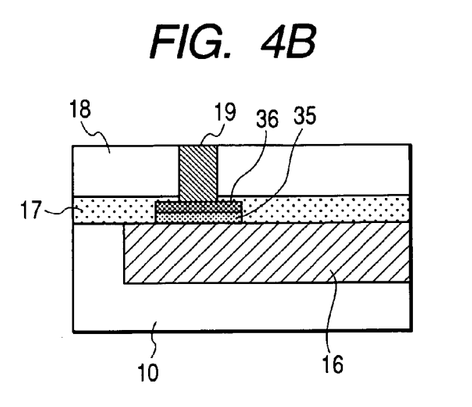

For illustration of this embodiment, the process of experimentation which was conducted in order to solve the problems to be solved by the present invention, and phenomena observed in the process will be described next. High temperature heat treatment for oxidization to form gate oxide film is necessary to make a vertical MOS transistor 20 or a horizontal MOS transistor 29 over the silicon plug 19. It was predicted that this high temperature heat treatment process might cause silicide reaction between the tungsten wiring 16 and the silicon plug 19, leading to film peeling or tungsten diffusion up to the upper MOS transistor with a resultant deterioration in transistor characteristics. For this reason, we explored a method of suppressing this sort of reaction in the interfaces. For the purpose of reaction suppression, on the analogy of the known polymetal gate and polycide gate structure mentioned earlier, we inserted a barrier layer between the tungsten wiring 16 and the silicon plug 19 though the order of layers was reversed. Specifically, the barrier layer consists of 10 nm thick tungsten nitride film 35 as shown in FIG. 4A, or a laminate of 10 nm thick tungsten nitride film 35 and 12 nm thick tungsten silicide 36 as shown in FIG. 4B. When this structure was employed, no reaction between the tungsten wiring 16 and the silicon plug 19 was observed even after high temperature heat treatment (700–900° C.) for the formation of the upper MOS transistor, which demonstrates the effectiveness of the barrier layer. However, the semiconductor integrated circuit device fabricated in this way could not achieve the design performance. Through analysis made to find the cause for this, it became apparent that the contact resistance between the barrier layer and the boron-doped silicon plug 19 was as high as $10^{-5}$ ohm-cm$^2$ to $10^{-2}$ ohm-cm$^2$ and attributable to the circuit performance deterioration. Therefore, we decided to do basic research on a reaction phenomenon to find what made the contact resistance in the interface between the tungsten wiring 16 and the silicon plug 19 very high First, we prepared a semiconductor integrated circuit device in which a heavily boron-doped silicon plug 19 was on and in direct touch with the tungsten wiring 16 and a semiconductor integrated circuit device in which heavily phosphorous-doped N-type silicon was on and in direct touch with it. The result of an experiment on these semiconductor integrated circuit devices is as follows. For the latter type (phosphorus-doped silicon), it was observed that reaction between the tungsten and the silicon began at 600° C. or so. When that silicon was used for the plug and a source or drain was laid over and connected with it in the process of making a MOS transistor, tungsten spread up to the channel for the transistor during heat treatment (700° C.–900° C.) and the resulting transistor failed to provide normal characteristics. In addition, the contact resistance between the tungsten layer and the phosphorus-doped silicon layer varied considerably ($10^{-7}$ ohm-cm$^2$ to $10^{31\ 2}$ ohm-cm$^2$) and some element did not show conductivity. By contrast, for the semiconductor integrated circuit device in which the boron-doped silicon was in direct touch with the tungsten film, it was found that no reaction did not occur in the interface before the heat treatment temperature reached 950° C. When the boron-doped silicon was employed for the plug and connected in the same way as above to make a MOS transistor, the transistor was found to provide MOS characteristics as designed. The contact resistance in the interface between the metal and the boron-doped silicon was as low as $10^{-7}$ ohm-cm$^2$ to $10^{-6}$ ohm-cm$^2$ and varied only slightly.

It is widely known that when undoped silicon is in direct touch with tungsten film is heat-treated, reaction in the interface begins at 550° C. or so. It is publicly known that when the heat treatment temperature rises to 700° C. or so in this condition, tungsten silicide WSi$_2$ is generated. In the above-cited references, various types of barrier film are described as a means to prevent this reaction. Therefore, it could not be predicted from the previous findings that in the above experiment on the boron-doped silicon in direct touch with the tungsten, an irregular film surface as a sign for silicide reaction was not observed after heat treatment at 950° C. or so. In order to find the cause for no reaction, we made analysis and evaluation by various methods including examinations of lattice images of interfaces, element distribution, crystal structure and electrical conductivity using a transmission electron microscope, secondary ion mass spectroscope, X-ray analyzer, measuring instrument for electric characteristics and so on.

Figure 3A:
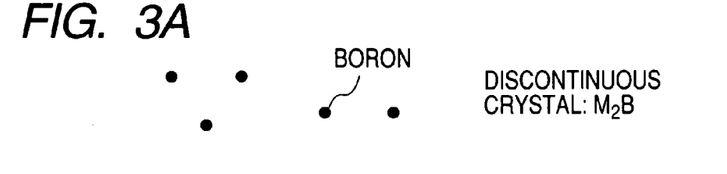
FIG. 3A shows a discontinuous crystal structure ($M_2B$), FIG. 3B a chain crystal structure (MB), FIG. 3C a hexagonal chain crystal structure ($M_3B_4$), FIG. 3D a mesh crystal structure ($MB_2$), and FIG. 3E a boron octahedron crystal structure ($MB_4/MB_6$)
Figure 3B:
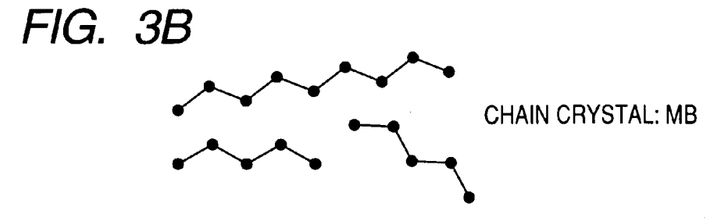
Figure 3C:
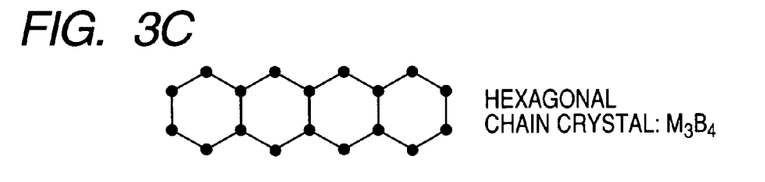
Figure 3D:
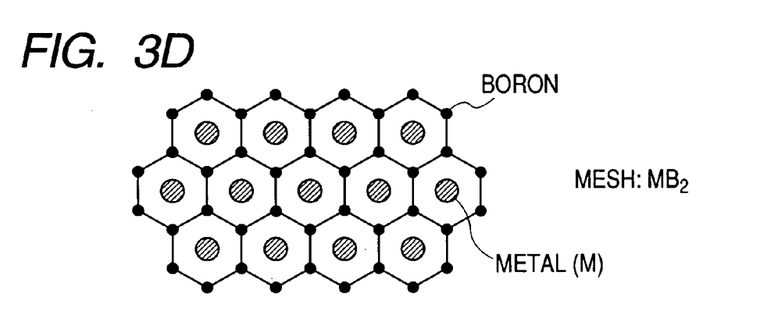
Figure 3E:
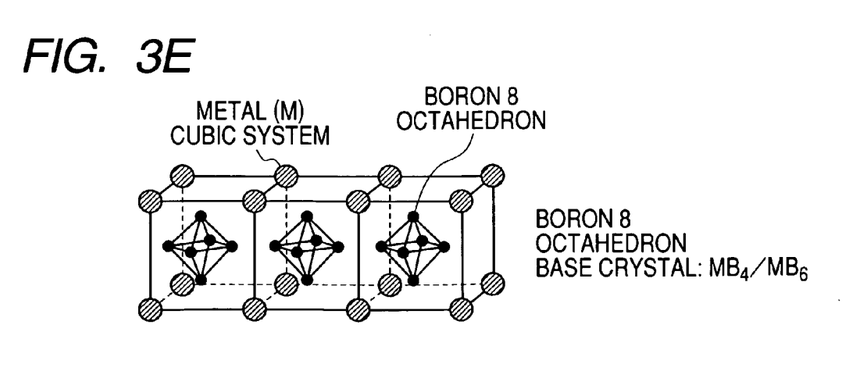
Figure 5:
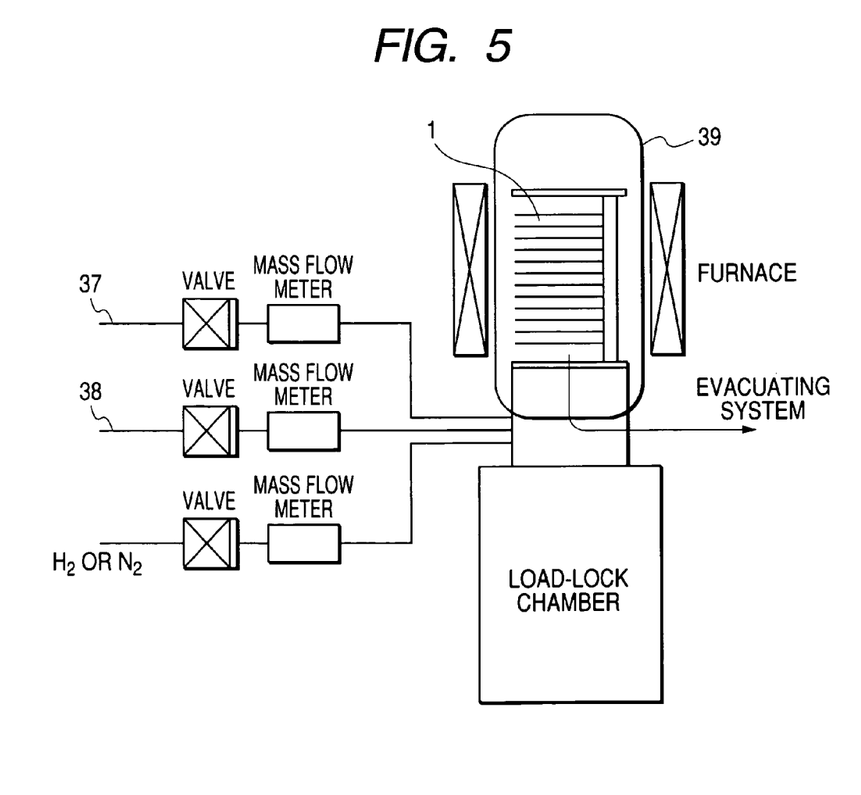
FIG. 5 shows the general structure of CVD equipment for formation of boron-doped silicon film as used in the first embodiment of the present invention.

As a result, it was confirmed that in the phosphorus-doped silicon/tungsten structure, WSi$_2$ with a close-packed hexagonal crystal structure was generated after heat treatment at 600° C. and WSi$_2$ with a rhombic tetragonal crystal structure was generated after heat treatment at 700° C. or so. This result was almost the same as in the prior art which uses undoped silicon in direct touch with tungsten. On the other hand, for the boron-doped silicon/tungsten structure, an irregular film surface or interface as a sign for reaction was not observed in a specimen heat-treated around 950° C. through a scanning electron microscope. Furthermore, when a lattice image of the interface was analyzed through a transmission electron microscope, a very thin film of tungsten-boron compound or tungsten-boron-silicon compound (silicon boride) was found. Therefore, we assumed that some metal boride (tungsten boride, etc) formed in the interface suppressed reaction. Then, analysis was made to investigate why such boride was produced. The silicon film which was employed in the above experiment was formed by CVD (Chemical Vapor Deposition) equipment where boron hydride gas 37 and silicon base reactive gas 38 such as dichlorosilane (silicon hydride chloride gas) or silane (silicon hydride gas) was introduced into a reaction chamber 39 for silicon film formation, as shown in FIG. 5. We assumed that in this gas introduction process, the boron hydride gas 37 was accidentally introduced into the chamber slightly earlier than the silicon base gas 38 and consequently metal boride 40 was generated in the interface. Based on the assumption, the boron hydride gas 37 was irradiated on the tungsten film on the substrate for ten seconds and the boride formed on the surface was analyzed using an X-ray oblique incident light electron spectrometer and reflection electron diffraction equipment. Our findings are as follows. When the temperature of the substrate irradiated with the boron hydride reactive gas 37 was around 350° C., discontinuous crystal $M_2B$ (boron cluster and base metal M atom bond) as shown in FIG. 3A or chain crystal MB (chain boron cluster and metal M atom bond) as shown in FIG. 3B or hexagonal chain crystal $M_3B_4$ (hexagonal chain boron cluster and base metal M atom bond) as shown in FIG. 3C was generated. When the temperature was relatively high at 600° C. or so, mesh crystal $MB_2$ (boron plane above and below an M atom) tungsten boride as shown in FIG. 3D or boron octahedron base crystal $MB_4/MB_6$ (born octahedron inside a metal (M) cubic system) as shown in FIG. 3E was generated.

Figure 6:
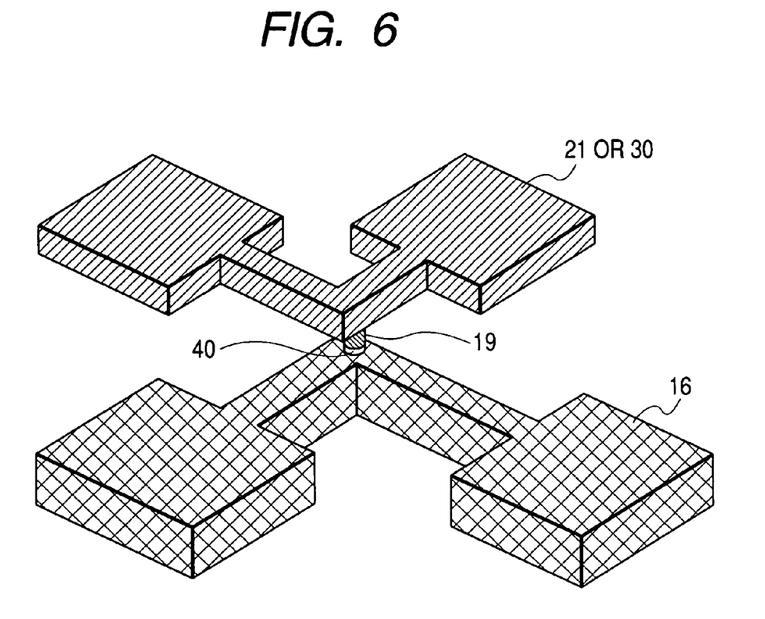
FIG. 6 illustrates a Kelvin element which is prepared to evaluate the contact resistance between tungsten wiring and a silicon plug in an embodiment of the present invention.

Next, in order to check whether these metal boride films functioned as layers to suppress reaction in the interface, first we prepared specimens by introducing the silicon hydride gas 38 initially and then the boron hydride gas 37, and observed them for reaction in the interface during or after heat treatment. Here, in one case, reaction began at heat treatment temperature of 600° C. or so and in another case, at relatively high temperature, or around 700° C. The time period of introduction of silicon hydride gas 38 was short in the former case while it was long in the latter case. In either case, it was found that when the silicon base gas 38 was introduced earlier than the boron hydride gas 37, reaction began around temperatures close to conventional heat treatment temperatures. From this experiment, it was found that even the presence of a very thin metal boride film 40 as shown in FIGS. 3A to 3E prevents reaction between the metal (tungsten, etc) and silicon. It also became apparent that when the boron hydride gas 37 was introduced (irradiated) first, the contact resistance between the tungsten and silicon which was measured using a Kelvin element (FIG. 6), a device widely used for contact resistance measurement, was as low as $5 \times 10^{-7}$ ohm-$cm^2$ to $8 \times 10^{-6}$ ohm-$cm^2$ and that a semiconductor integrated circuit device thus fabricated provides desirable MOS electrical characteristics without drain junction breakdown or gate insulating film withstand voltage trouble.

In this embodiment, the boride on the metal film surface is prepared by making an opening in the interlayer insulating film in order to make a plug and irradiating the opening with the above compound gas. Alternatively, boride may be formed by patterning the metal wiring and irradiating it with the compound gas before interlayer insulating film is deposited and an opening is made there.

<Second Embodiment>

According to the first embodiment, the metal boride 40 is formed by irradiating the tungsten film surface with boron hydride gas 37. According to this embodiment, for the above semiconductor integrated circuit devices shown in FIG. 1 and FIG. 2, an opening for the silicon plug 19 is made at a given position on the tungsten wiring 16 and then boron ions are implanted into the tungsten film surface in the bottom of the opening at $5 \times 10^{14}$ atoms/$cm^2$ (5 keV). If boron ions should be directly implanted into the tungsten wiring 16, channeling of implanted ions would occur in the film and it would be difficult to form metal boride 40 on the tungsten wiring 16 surface. For this reason, in this embodiment, in the process of making an opening in the tungsten wiring 16 (FIGS. 1 and 2), only the interlayer insulating film 18 is removed by dry etching while the 30 nm thick silicon nitride film 17 formed by plasma CVD remains intact. Then, boron ions are implanted through this non-crystalline nitride film 17 into the tungsten film 16 so as to prevent channeling in the tungsten film 16. After this, tungsten boride 40 is formed on the tungsten film 16 surface through nitrogen heat treatment at 500° C. and finally the nitride film 17 remaining on the tungsten film 16 surface in the bottom of the opening is removed by hot phosphoric acid wet etching (it may also be removed by dry etching).

Alternatively, implantation of boron ions and heat treatment as stated above may be done after patterning of the tungsten film to form boride, followed by deposition of interlayer insulating film and making of an opening.

Steps other than the above ion implantation step are the same as in the first embodiment. In this embodiment, after formation of the boride 40, the specimen is exposed to the atmospheric air for a long time until it is loaded into CVD equipment to form boron-doped silicon film for the silicon plug 19. Hence, we evaluated natural oxide growth on the tungsten surface due to exposure to the atmospheric air by X-ray photoelectron spectroscopy. In this evaluation, simple tungsten film (no boride formation on the surface) was used as control for comparison. As a measure for the degree of surface oxidization, the photoelectron spectral intensity which indicates the metal (tungsten) to oxygen bond, or metal oxidization condition, was compared with the photoelectron spectral intensity which indicates the metal (tungsten) to metal (tungsten) bond condition. For the specimen for comparison (control), the spectral intensity ratio rapidly increased from 0.46 just after its unloading from the CVD equipment for tungsten film formation as the time of exposure to the atmospheric air went on. About one hour after, the ratio reached 0.53, after which it gradually increased. On the other hand, for a specimen with tungsten boride 40 formed on the surface, the spectral intensity ratio, a measure for the degree of oxidization, was very low at 0.32 and even when it was left exposed to the atmospheric air for one day after boride formation, the ratio only increased to 0.36. In other words, it was found that without formation of the boride 40, the tungsten oxide grew as soon as the specimen was unloaded from the CVD equipment and its tungsten film was exposed to the atmospheric air and that with formation of the boride 40 on the surface, oxidization of the tungsten was suppressed and oxidization resistance was improved. It should be noted that the presence of tungsten oxide on the surface of the tungsten wiring 16 may cause the silicon of the silicon plug 19 to reduce the tungsten oxide to silicon oxide in the interface in the heat treatment process of making the vertical MOS transistor 20 or horizontal MOS transistor 29, resulting in poor conductivity.

As discussed above, the tungsten boride 40 was proven to be resistant to oxidization. However, if the boride 40 has a high resistance, the resistance is applied to the drain of the vertical MOS transistor 20 or horizontal MOS transistor 29 and desired transistor characteristics may not be attained. For this reason, we measured the resistance of the tungsten boride 40. As a result, we confirmed that the resistivity of the boride 40 formed in the abovementioned manner was 20 μ ohm-cm to 25 μ ohm-cm, which is almost equal to that of the tungsten film used for the wiring 19 (14 μ ohm-cm to 20 μ ohm-cm) and does not affect transistor characteristics.

We fabricated a semiconductor integrated circuit device based on the above basic data and confirmed that the contact resistance between the tungsten wiring 16 and the silicon plug 19 and characteristics of this semiconductor integrated circuit device were equivalent to those of the first embodiment.

This suggests that the problems to be solved by the invention, namely suppression of metal-silicon reaction in high temperature heat treatment for the manufacture of semiconductor devices and reduction in contact resistance between the metal layer and boron-doped silicon layer, can be solved by deposition of silicon film after formation of boride on the metal surface.

Also, it has been demonstrated that tungsten boride suppresses oxidization of tungsten and improves tungsten's resistance to chemicals. For instance, although tungsten is easily etched by a hydrogen peroxide solution, when the surface is coated by the boride film, the time which it takes for the tungsten wiring to be etched out is approximately eight times longer than when it is not coated by the boride film. This improvement in etching resistance provides more latitude in the process of manufacturing semiconductor integrated circuit devices.

<Third Embodiment>

If a relatively thick layer of natural tungsten oxide exists on the tungsten film 19, it will be difficult to form the boride 40 as seen in the first embodiment. In this embodiment, although reaction does not occur between the tungsten wiring 16 and the silicon plug 19 in high temperature heat treatment as in the second embodiment, metal oxide reduction reaction occurs due to the silicon and consequently a silicon oxide layer is formed in the interface. In some cases, the contact resistance between the metal and silicon is $10^{-5}$ ohm-cm$^2$ or more, or the semiconductor device delivers particular electric conductivity characteristics attributable to the presence of insulator in the interface.

Therefore, for formation of metal boride, it is necessary to remove metal oxide such as tungsten oxide as much as possible. Hence, this embodiment is intended to provide a method of removing such metal oxide and a process of fabricating a semiconductor integrated circuit device in accordance with the method. Specifically, the problem to be solved here is to remove tungsten film oxidized naturally on the surface of the tungsten wiring 16 in the bottom of the opening for formation of the silicon plug 19. To do this, we selected wet etching technology and explored the most suitable etching chemical. A hydrofluoric acid based etchant is not suitable because it may etch the silicon oxide and expand the opening. After examination of various etchants, we found that an aqueous ammonia solution of 70° C. or less removes the natural tungsten oxide on the surface of the tungsten wiring 19 efficiently with virtually no expansion of the opening. In this experiment, we used water which contains not less than 1 millimole of ammonia per liter. For this embodiment, the amount of existing tungsten oxide film was measured by X-ray photoelectron spectroscopy. Before removal of natural oxide on the surface with this aqueous ammonia solution, the ratio of the photoelectron spectral intensity of the metal (tungsten) to oxygen bond to that of the metal (tungsten) to metal (tungsten) bond was 0.44. After the removal process with the solution, the ratio decreased to 0.26. Thus, it was confirmed that the aqueous ammonia solution efficiently removed the tungsten oxide. Then, we measured the oxidation-reduction potential and pH of the solution employed. The reduction potential was in the range of 0.7 V–0.9 V and the pH value was in the range of pH 9–pH 11.5. When this result was viewed with reference to a constitutional diagram of oxidation reduction potentials and pH for tungsten and water, it was considered that only natural tungsten oxide present on the surface was dissolved as $WO_4^{2-}$ ions into the aqueous ammonia solution without etching the tungsten (W). With the same procedure as above, we measured the oxidation-reduction potentials and pH of ultra-pure water and hydrogen-containing water (functional water) as well. For both, the pH value was about pH 7 and the reduction potential was in the range of 0.3 V–0.4 V. Hence, from the above constitutional diagram, it was understood that only the natural tungsten oxide was selectively removed. In this case, however, the removal efficiency of the ultra-pure water and hydrogen-containing water is lower than that of the aqueous ammonia water.

Based on the above experimental result, after an opening was made in the tungsten wiring 16 as in the first embodiment, the tungsten oxide in the bottom of the opening was removed with the aqueous ammonia solution. Then, the specimen was left in the atmospheric air only for 30 minutes or less, and loaded in the CVD equipment for formation of silicon film and evacuated. As in the first embodiment, the specimen was heated at 400° C. and boron hydride gas was initially introduced for ten seconds, and while introduction of the gas was underway, dichlorosilane gas ($SiH_2Cl_2$) was introduced to form boron-doped silicon film. The other steps were the same as those in the first embodiment.

In this embodiment, the contact resistance between the tungsten wiring 16 and silicon plug 19 in a 10-inch wafer which was measured using a Kelvin element varied only in a limited range and was low ($3 \times 10^{-7}$ ohm-cm$^2$ to $2 \times 10^{-6}$ ohm-cm$^2$). This demonstrates the effectiveness of the aqueous ammonia solution.

<Fourth Embodiment>

In the third embodiment, the contact resistance is lower and variation in the contact resistance in a wafer or among lots is smaller than in the first embodiment. However, there still exist devices with contact resistance out of the range of $10^{-7}$ ohm-cm$^2$ to $2 \times 10^{-6}$ ohm-cm$^2$. In the effort to find the cause for this, it became apparent that this happened in two situations: some organic matter existed on the tungsten surface in the bottom of the opening or the natural tungsten oxide could not be removed with the aqueous ammonia solution. In the former situation, such organic matter was produced in the dry etching process for making the opening and could not be removed by post-treatment with an asher. On the other hand, the process of removal with the aqueous ammonia solution was reexamined. The findings are as follows. When the tungsten oxide is a stable oxide ($WO_3$), it can be easily removed with the aqueous ammonia solution.

Otherwise, or if it is a low-oxygen tungsten compound, the oxide removal efficiency deteriorates. Presumably, this is because the oxide is a mixture of metal tungsten and oxide. Hence, we explored a method of removing remaining organic matter completely and converting the low-oxygen tungsten oxide into $WO_3$ to increase tungsten oxide removal efficiency. The method which we developed to perform both tasks is simultaneous irradiation with high energy ultraviolet light (150 nm or so) and lower energy ultraviolet light (250 nm or so). This energy level is close to that of ultraviolet light for an ordinary photoresist removal process (250 nm or so). With this energy level, it is difficult to decompose organic matter with C=C or C=F bond. For decomposition of such organic matter, ultraviolet light with a wavelength of 150 nm or so is needed. Such organic matter remaining in the bottom of the opening is decomposed by this high-energy ultraviolet light, thereby generating ozone. The generated ozone is decomposed by ultraviolet light with a wavelength of 250 nm or so and the organic matter is converted into gaseous matter and removed through the mediation of the oxygen resulting from the decomposition. This resulting oxygen is used not only to remove the remaining organic matter but also to convert the low-oxygen tungsten oxide present on the tungsten surface into $WO_3$. This condition was evaluated using the X-ray photoelectron spectroscope as stated earlier. Since this spectroscope is not suitable for microanalysis, we used tungsten film (not patterned for wiring) formed on a silicon wafer as a specimen. From the analysis through the spectroscope, it was confirmed that while various low-oxygen tungsten oxides (including $W_{18}O_{49}$) existed in addition to $WO_3$ before irradiation with ultraviolet light with the above two different wavelengths, almost all of them were converted into $WO_3$ after the irradiation.

Based on the above result, the specimen was irradiated with ultraviolet light with the above two different wavelengths for ten minutes before treatment with the aqueous ammonia solution as used in the third embodiment, where the other conditions were the same as in the third embodiment. The finding from this is as follows. In a semiconductor integrated circuit device according to this embodiment, the contact resistance between the tungsten wiring 16 and silicon plug 19 is very low at $9\times10^{-8}$ ohm-cm$^2$ to $5\times10^{-7}$ ohm-cm$^2$ with and variation in the contact resistance in a 10-inch wafer or among semiconductor integrated circuit device production lots is small. This result is almost equivalent to the source-drain current calculated on the assumption that there is no contact resistance in the interface concerned of the drain of the upper MOS transistor.

Although tungsten is used as the material for the wiring 16 as shown in FIGS. 1 and 2, obviously IVa elements such as molybdenum, tantalum, titanium, zirconium, and hafnium as well as IVa nitrides and laminates of these elements may be used. When boride or a metal-boron-silicon compound (silicon boride) is formed on any of these metals or nitrides, the same advantageous effects as in the above embodiments can be produced, though clearly some processing conditions must be adjusted depending on the material used.

So far, some preferred embodiments of the invention which has been made by the inventors have been described in detail. The invention is not limited to these embodiments but may be embodied in any modified form without departing the scope and spirit thereof. Specifically, although one type of MOS transistor is laid over the wiring provided on the main surface of the silicon single crystal substrate in the embodiments shown in FIGS. 1 and 2, both a vertical MOS transistor and a horizontal MOS transistor may be laid over it or a further MOS transistor may be laid over these MOS transistors. In these cases, the wiring according to the invention may be in touch with the silicon plug. Even so, the invention will bring about the same advantageous effects as mentioned above.

<Fifth Embodiment>

For the first embodiment, research was conducted on the problems of film peeling due to metal-silicon reaction in the process of making a phosphorous-doped silicon plug in the opening in the metal wiring or deterioration in characteristics of a vertically multi-layered MOS transistor over it. In this embodiment, in order to avoid these problems, metal base boride or a metal-boron-silicon base compound is formed on the metal surface concerned in the bottom of the opening through a self-align process as in the above embodiments and a phosphorus-doped silicon plug is formed through formation of phosphorous-doped silicon film in an ordinary manner. In this embodiment, the upper MOS transistor (FIGS. 1 and 2) to be connected with this plug is an N-channel MOS transistor with a source and a drain which are doped with phosphorus or arsenic. In this structure, when the metal-boron base boride formed on the metal surface in the opening through a self-align process was heat-treated at temperatures from 700° C. to 950° C. for formation of the MOS transistor, reaction between the metal and silicon plug was prevented effectively. The contact resistance between the phosphorus-doped silicon plug and tungsten wiring was $1\times10^{-7}$ ohm-cm$^2$ to $5\times10^{-6}$ ohm-cm$^2$, which is low enough to eliminate the possibility of causing a problem related to contact resistance in the manufacture of a semiconductor integrated circuit device.

What is claimed is:

1. A semiconductor integrated circuit device comprising:
    tungsten wiring which is formed on a semiconductor substrate;
    a silicon-containing insulating film formed on the tungsten wiring;
    an opening which is made by removing a given area of the insulating film and boring it until the tungsten wiring is reached; and
    a plug of silicon doped with N-type or P-type impurities, buried in the opening,
    wherein a metal compound containing the tungsten and boron is formed on the surface of the tungsten present in the bottom of the opening.

2. A semiconductor integrated circuit device comprising:
    tungsten wiring which is formed on a semiconductor substrate;
    a silicon-containing insulating film formed on the tungsten wiring; and
    a plug of silicon doped with N-type or P-type impurities, formed on a given area of the tungsten wiring,
    wherein a metal compound containing the tungsten and boron is formed on the surface of the tungsten.

3. The semiconductor integrated circuit device according to claim 1, wherein the metal compound contains a metal element as an ingredient of the tungsten wiring and silicon.

4. The semiconductor integrated circuit device according to claim 1,
    wherein the plug consists of a silicon layer doped with N-type or P-type impurities, buried in the opening; and
    wherein the silicon layer remains inside the opening or inside the opening and on the insulating film surface around the opening.

5. The semiconductor integrated circuit device according to claim 1, wherein the plug consists of a silicon layer doped with N-type or P-type impurities, buried in the opening; and wherein one end of the plug is in touch with a metal compound of the tungsten and boron, formed on the surface of the tungsten present in the bottom of the opening, and at its other end, the silicon layer remains inside the opening or inside the opening and on the insulating film surface around the opening.

6. The semiconductor integrated circuit device according to claim 1, wherein a silicon layer doped with N-type or P-type impurities which is formed on the insulating film with one end of it connected with the plug is used as a source or drain of a MOS transistor.

7. The semiconductor integrated circuit device according to claim 1, having a vertically multi-layered MOS transistor on the semiconductor substrate, wherein a first silicon layer doped with N-type or P-type impurities of a first concentration which is formed on the insulating film with one end of it connected with the plug is used as a source or drain of a MOS transistor, wherein a second silicon layer is laid over the first silicon layer and used as a channel region, the second silicon layer containing virtually no such impurities as contained in the first silicon layer or containing impurities of the type opposite to the type of the impurities contained in the first silicon layer as effective impurities, and wherein a third silicon layer doped with N-type or P-type impurities of the first concentration is laid over the second silicon layer and used as a drain or source.

8. The semiconductor integrated circuit device according to claim 1, having a MOS transistor, wherein a first silicon layer doped with N-type or P-type impurities of a first concentration which lies on the insulating film with one end of it connected with the plug, parallel to the semiconductor substrate, is used as a source or drain of a MOS transistor, wherein a second silicon layer adjacent to the first silicon layer is used as a channel, the second silicon layer containing virtually no such impurities as contained in the first silicon layer or containing impurities of the type opposite to the type of the impurities contained in the first silicon layer as effective impurities, and wherein a third silicon layer adjacent to the second silicon layer and doped with N-type or P-type impurities of the first concentration is used as a drain or source.

9. The semiconductor integrated circuit device according to claim 1, wherein the P-type impurities are boron.

10. The semiconductor integrated circuit device according to claim 1, wherein the N-type impurities are phosphorus or arsenic.

* * * * *